(12) United States Patent
Jia et al.

(10) Patent No.: US 10,453,743 B2
(45) Date of Patent: Oct. 22, 2019

(54) BARRIER LAYER REMOVAL METHOD AND SEMICONDUCTOR STRUCTURE FORMING METHOD

(71) Applicant: ACM Research (Shanghai) Inc., Shanghai (CN)

(72) Inventors: Zhaowei Jia, Shanghai (CN); Dongfeng Xiao, Shanghai (CN); Jian Wang, Shanghai (CN); Hui Wang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 0 days.

(21) Appl. No.: 15/518,817

(22) PCT Filed: Oct. 17, 2014

(86) PCT No.: PCT/CN2014/088812
§ 371 (c)(1),
(2) Date: Apr. 13, 2017

(87) PCT Pub. No.: WO2016/058175
PCT Pub. Date: Apr. 21, 2016

(65) Prior Publication Data
US 2017/0221753 A1    Aug. 3, 2017

(51) Int. Cl.
*H01L 21/768*      (2006.01)
*H01L 21/3213*     (2006.01)
(Continued)

(52) U.S. Cl.
CPC .... *H01L 21/7684* (2013.01); *H01L 21/31116* (2013.01); *H01L 21/3213* (2013.01);
(Continued)

(58) Field of Classification Search
CPC ......... H01L 2924/0002; H01L 2924/00; H01L 21/76846; H01L 21/76843;
(Continued)

(56) References Cited

U.S. PATENT DOCUMENTS

2010/0096360 A1   4/2010  Wang et al.
2014/0021615 A1*  1/2014  Ryan ................. H01L 23/53209
                                                     257/751

FOREIGN PATENT DOCUMENTS

CN        1608116 A     4/2005
CN     101205442 A      6/2008
(Continued)

OTHER PUBLICATIONS

WO2010/020092.*
(Continued)

*Primary Examiner* — Tony Tran
(74) *Attorney, Agent, or Firm* — Osha Liang LLP

(57) ABSTRACT

The present invention provides a barrier layer removal method, wherein the barrier layer includes at least one layer of ruthenium or cobalt, the method comprising: removing the barrier layer including ruthenium or cobalt formed on non-recessed areas of a semiconductor structure by thermal flow etching. The present invention further provides a semiconductor structure forming method, comprising: providing a semiconductor structure which includes a dielectric layer, a hard mask layer formed on the dielectric layer, recessed areas formed on the hard mask layer and the dielectric layer, a barrier layer including at least one layer of ruthenium or cobalt formed on the hard mask layer, sidewalls of the recessed areas and bottoms of the recessed areas, a metal layer formed on the barrier layer and filling the recessed areas; removing the metal layer formed on the non-recessed areas and the metal in the recessed areas, and remaining a certain amount of metal in the recessed areas; removing the
(Continued)

barrier layer including ruthenium or cobalt formed on the non-recessed areas, and the hard mask layer by thermal flow etching.

6 Claims, 15 Drawing Sheets

(51) Int. Cl.
 *H01L 21/321* (2006.01)
 *H01L 21/311* (2006.01)

(52) U.S. Cl.
 CPC .. *H01L 21/32115* (2013.01); *H01L 21/32125* (2013.01); *H01L 21/32134* (2013.01); *H01L 21/32135* (2013.01); *H01L 21/32138* (2013.01); *H01L 21/76849* (2013.01); *H01L 21/76865* (2013.01)

(58) Field of Classification Search
 CPC ... H01L 2924/00014; H01L 2924/1461; H01L 21/28273
 See application file for complete search history.

(56) References Cited

FOREIGN PATENT DOCUMENTS

| | | |
|---|---|---|
| CN | 101840884 A | 9/2010 |
| CN | 103000575 A | 3/2013 |
| JP | 2001-189303 A | 7/2001 |
| JP | 2001-284317 A | 10/2001 |
| JP | 2007-42662 A | 2/2007 |
| JP | 2008-244039 A | 10/2008 |
| JP | 2009-506536 A | 2/2009 |
| JP | 2011-134771 A | 7/2011 |
| JP | 2011-134885 A | 7/2011 |
| WO | 2013/148880 A1 | 10/2013 |
| WO | 2013/173998 A1 | 11/2013 |

OTHER PUBLICATIONS

International Search Report issued in corresponding application No. PCT/CN2014/088812 dated Jul. 17, 2015 (2 pages).
Written Opinion of the International Searching Authority issued in corresponding application No. PCT/CN2014/088812 dated Jul. 17, 2015 (3 pages).
Office Action issued in corresponding Japanese Application No. 2017-520881 dated Jul. 31, 2018, and English translation thereof (10 pages).

* cited by examiner

BARRIER LAYER REMOVAL METHOD AND SEMICONDUCTOR STRUCTURE FORMING METHOD

BACKGROUND OF THE INVENTION

1. Field of the Invention

The present invention generally relates to integrated circuit fabrication process, and more particularly relates to a barrier layer removal method and a semiconductor structure forming method.

2. The Related Art

In a semiconductor structure, a traditional material for forming electronic circuitry is aluminum. But as the feature size of integrated circuit has decreased, aluminum is no longer fit for forming the electronic circuitry in the semiconductor structure because aluminum has high resistance. Copper which has a good electrical conductivity replaces aluminum and is used in the integrated circuit. But copper has a defect that copper is easy to diffuse to $SiO_2$, which seriously affects the performance of the integrated circuit. Therefore, to solve the issue, a barrier layer is used for preventing the copper from diffusing to the $SiO_2$.

At present, the material of the barrier layer normally chooses tantalum (Ta), tantalum nitride (TaN), titanium (Ti) or titanium nitride (TiN) and the barrier layer formed on non-recessed areas of the semiconductor structure is removed mainly by chemical mechanical polishing (CMP). For 20 nm or below 20 nm node process, the thickness of the barrier layer must be enough thin. For the barrier layer of tantalum, tantalum nitride, titanium or titanium nitride, if the thickness of the barrier layer of tantalum, tantalum nitride, titanium or titanium nitride is too thin, the ability of the barrier layer for preventing copper from diffusing to $SiO_2$ will reduce, so the barrier layer of tantalum, tantalum nitride, titanium or titanium nitride is not fit for 20 nm or below 20 nm node process.

Hence, there needs to find new material to form the barrier layer in 20 nm or below 20 nm node process. Facts proved that cobalt (Co) or ruthenium (Ru) can be used for forming the barrier layer. The ability of cobalt or ruthenium for preventing copper from diffusing to $SiO_2$ is much stronger than that of tantalum, tantalum nitride, titanium or titanium nitride. But when using the cobalt as the barrier layer in a semiconductor structure, potential chemical corrosion of cobalt liner along sidewall of recessed area (such as trench, via) happens during chemical mechanical polishing the barrier layer when the liner is in contract with slurry. Galvanic corrosion issues on top of the recessed area exist where the copper forms a galvanic couple with the cobalt liner. Relatively, the hardness of ruthenium is high. When chemical mechanical polishing the barrier layer of ruthenium, it is easy to generate scratches.

Therefore, due to the properties of the new material, the barrier layer is hard to remove by CMP, which induces a bottleneck of the new material industrialization.

SUMMARY

The present invention provides a barrier layer removal method, wherein the barrier layer includes at least one layer of ruthenium or cobalt, the method comprising: removing the barrier layer including ruthenium or cobalt formed on non-recessed areas of a semiconductor structure by thermal flow etching.

The present invention further provides a semiconductor structure forming method, comprising: providing a semiconductor structure which includes a dielectric layer, a hard mask layer formed on the dielectric layer, recessed areas formed on the hard mask layer and the dielectric layer, a barrier layer including at least one layer of ruthenium or cobalt formed on the hard mask layer, sidewalls of the recessed areas and bottoms of the recessed areas, a metal layer formed on the barrier layer and filling the recessed areas; removing the metal layer formed on the non-recessed areas and the metal in the recessed areas, and remaining a certain amount of metal in the recessed areas; removing the barrier layer including ruthenium or cobalt formed on the non-recessed areas and the hard mask layer by thermal flow etching.

In the present invention, the barrier layer including ruthenium or cobalt is removed by thermal flow etching, which can conquer the disadvantages of chemical mechanical polishing the barrier layer of ruthenium or cobalt. Besides, in the semiconductor structure forming process, utilizing thermal flow etching to remove the barrier layer and the hard mask layer will not produce mechanical force. What is more, the metal layer formed on the non-recessed areas can be removed by electropolishing, which will not produce mechanical force either. Because there is no mechanical force applied to the dielectric layer during the semiconductor structure forming process, so low k/ultra low k dielectric materials can be used in the semiconductor structure.

BRIEF DESCRIPTION OF THE DRAWINGS

FIG. 2 is a flow chart illustrating a semiconductor structure forming method according to an exemplary embodiment of the present invention.

FIG. 3-1 to FIG. 3-4 are cross-sectional views illustrating a semiconductor structure forming process according to another exemplary embodiment of the present invention.

FIG. 4 is a flow chart illustrating a semiconductor structure forming method according to another exemplary embodiment of the present invention.

FIG. 5-1 to FIG. 5-4 are cross-sectional views illustrating a semiconductor structure forming process according to another exemplary embodiment of the present invention.

DETAILED DESCRIPTION OF EMBODIMENTS

The present invention provides a barrier layer removal method, wherein the barrier layer includes at least a layer of ruthenium or cobalt. The barrier layer which includes ruthenium or cobalt and is formed on non-recessed areas of a semiconductor structure is removed by thermal flow etching. Examples that follow will illustrate the barrier layer removal method and a semiconductor structure forming method.

Figure 1:
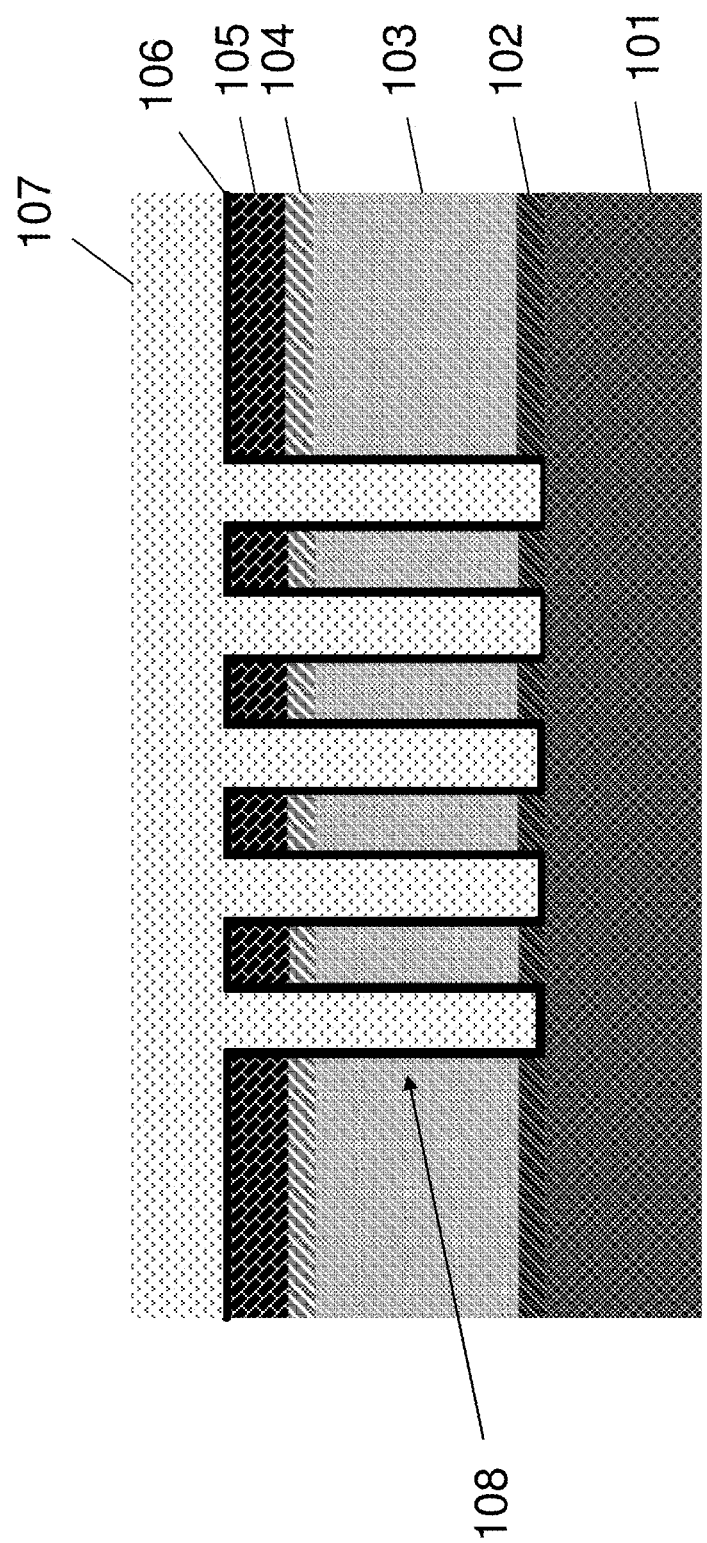
FIG. 1-1 to FIG. 1-3 are cross-sectional views illustrating a semiconductor structure forming process according to an exemplary embodiment of the present invention.
Figures 1, 2:
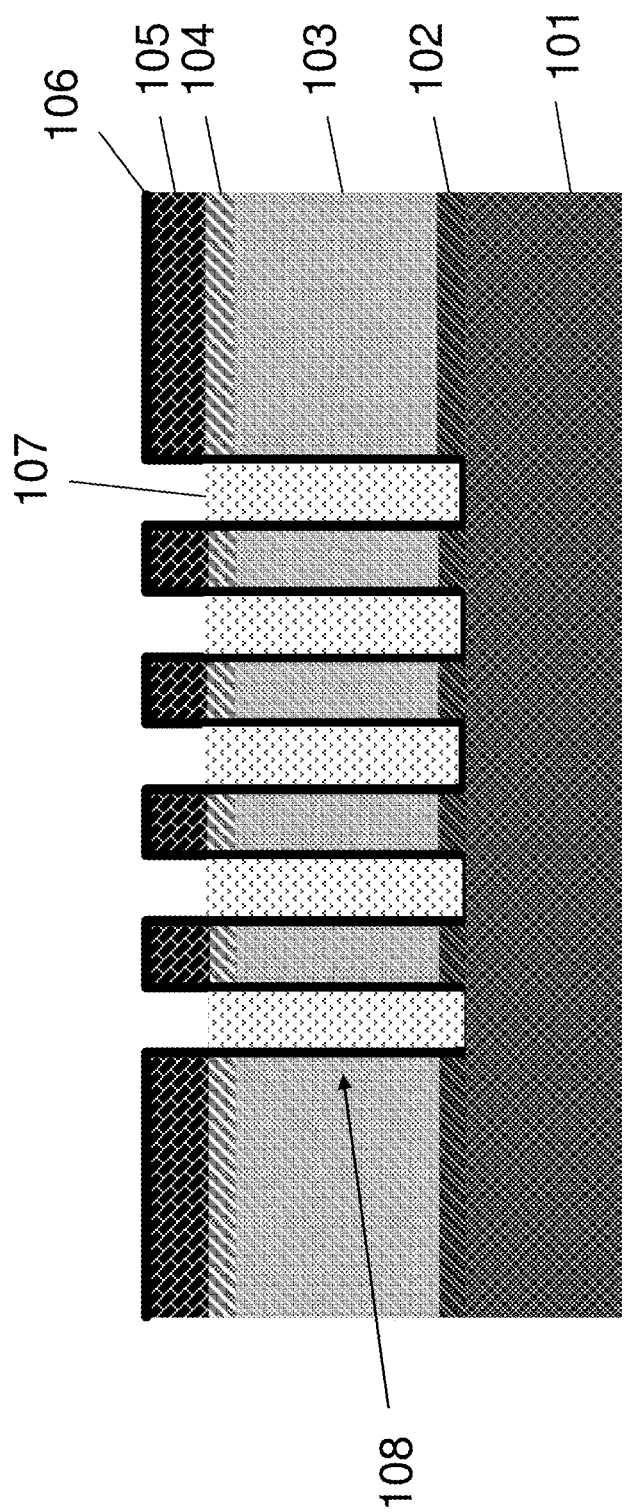
Figures 1, 2, 3:
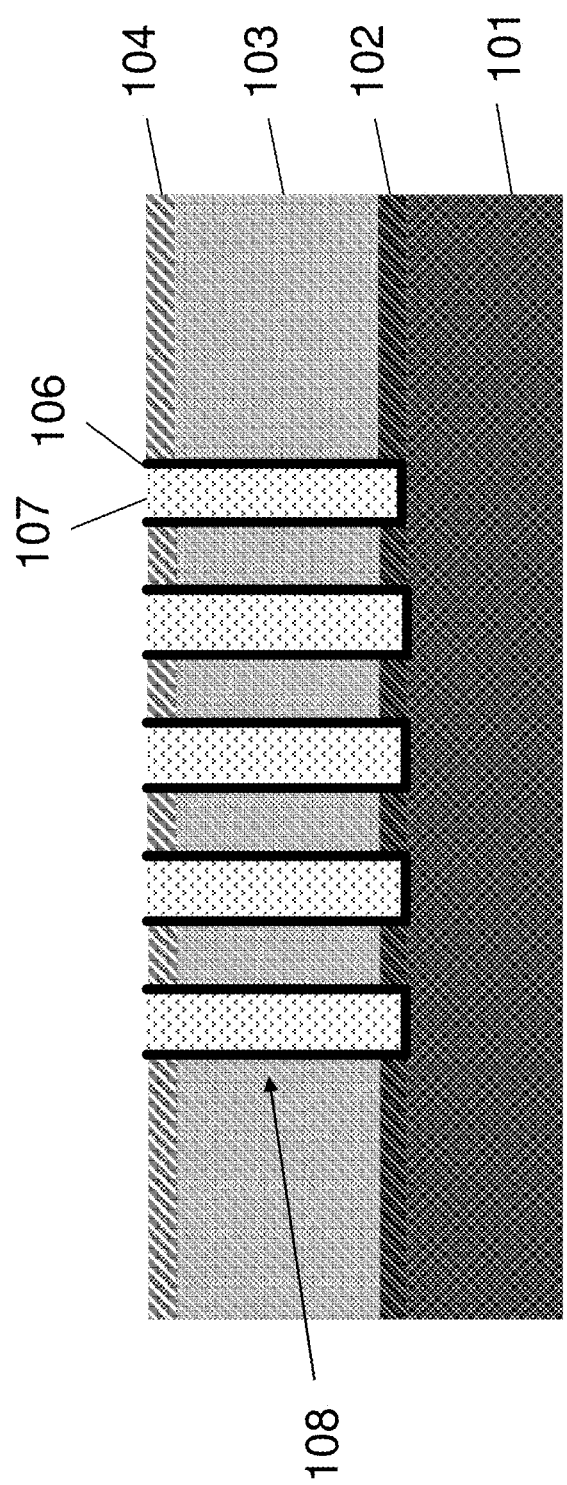
Figure 2:
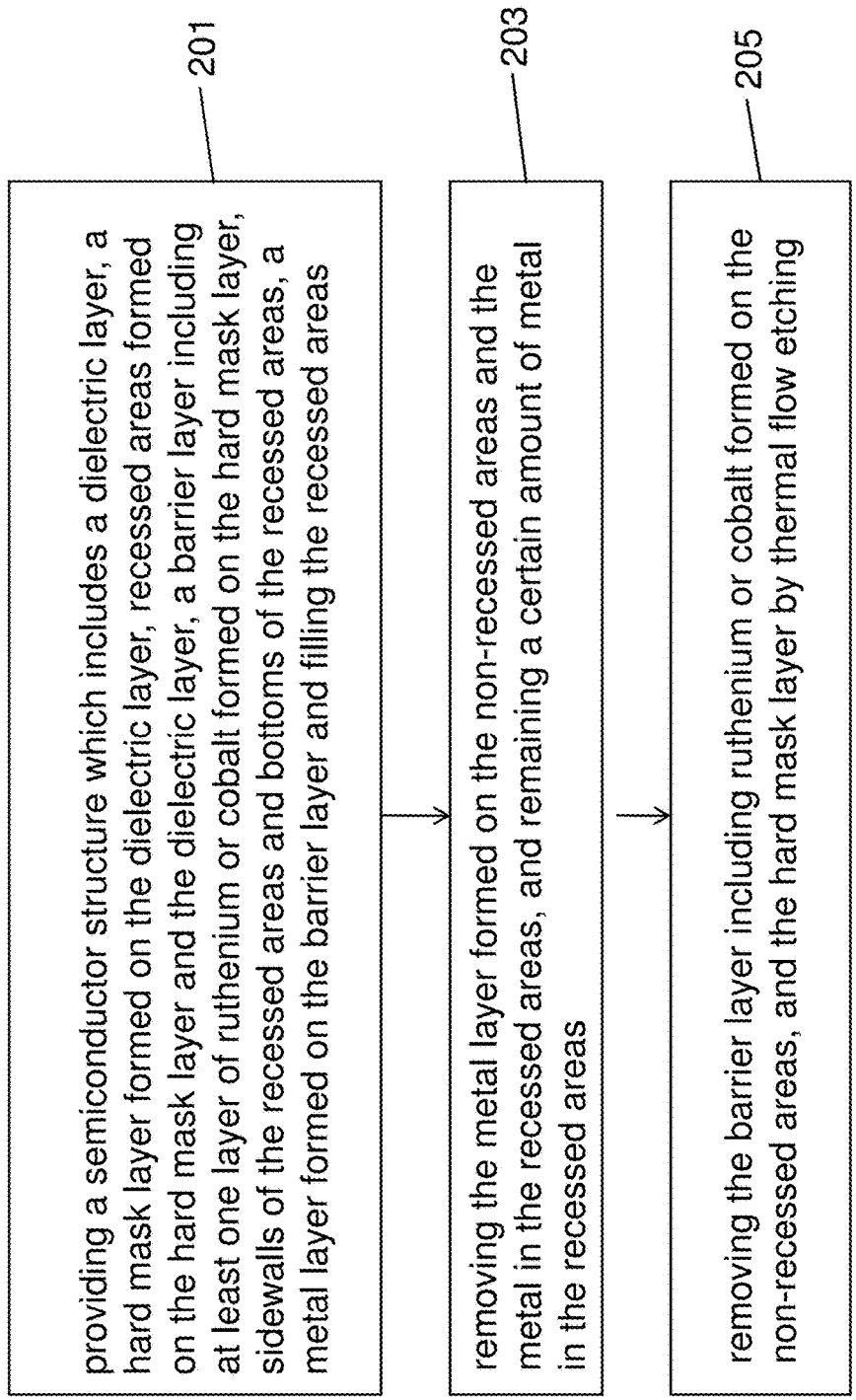

Please refer to FIG. 1-1 to FIG. 1-3, showing a process of forming a semiconductor structure according to an exemplary embodiment of the present invention. The semiconductor structure includes a substrate 101, such as a wafer. The substrate 101 may already contain IC devices and necessary contacting structures in it which are not shown in the figures. In some applications, an isolation layer 102 is formed on the substrate 101. The isolation layer 102 can be SiCN. A dielectric layer is formed on the isolation layer 102. If there is no isolation layer formed on the substrate, the dielectric layer can be formed on the substrate directly. The dielectric layer may include materials such as SiO$_2$, SiOC, SiOF, SiLK, BD, BDII, BDIII, etc. Preferably, the dielectric layer selects low-k dielectric material for reducing capacitance between the semiconductor structures in a semiconductor device. According to different structure requirement, the dielectric layer can be composed of two layers or more than two layers. In the embodiment shown in the figures, the dielectric layer includes two layers, a first dielectric layer 103 formed on the isolation layer 102 and a second dielectric layer 104 formed on the first dielectric layer 103. The first dielectric layer 103 can be a low-k dielectric layer. The second dielectric layer 104 can be TEOS. A hard mask layer 105 is deposited on the second dielectric layer 104. The material of the hard mask layer 105 may include titanium nitride, tantalum nitride, tungsten or tungsten nitride. Recessed areas, for example, trenches, vias, etc., are formed on the hard mask layer 105, the second dielectric layer 104, the first dielectric layer 103 and the isolation layer 102 by using existing methods in prior art. A recessed area 108 is shown in the figures as an example.

Then a barrier layer 106 is deposited on the hard mask layer 105, sidewall of the recessed area 108 and bottom of the recessed area 108. The material of the barrier layer 106 at least includes ruthenium or cobalt for satisfying the requirement of 20 nm or below 20 nm node process. In order to improve the adhesivity between the barrier layer 106 and the hard mask layer 105, the second dielectric layer 104, the first dielectric layer 103, and the isolation layer 102, preferably, the barrier layer 106 includes two layers, a first barrier layer and a second barrier layer. The first barrier layer is formed on the hard mask layer 105, sidewall of the recessed area 108 and bottom of the recessed area 108. The material of the first barrier layer can choose titanium, titanium nitride, tantalum or tantalum nitride. The second barrier layer is formed on the first barrier layer, and the material of the second barrier layer is ruthenium or cobalt. Typically, if the second barrier layer is cobalt, the first barrier layer preferably chooses titanium nitride, and if the second barrier layer is ruthenium, the first barrier layer preferably chooses tantalum nitride.

A metal layer 107 is formed on the barrier layer 106 and fills the recessed area 108. In some applications, a metal seed layer can be deposited on the barrier layer 106 before depositing the metal layer 107. The metal seed layer may include the same material as the metal layer 107 in order to facilitate the deposition and bonding of the metal layer 107 onto the barrier layer 106. The metal layer 107 fills the recessed area 108 and covers non-recessed areas, as shown in FIG. 1-1. Preferably, the metal layer 107 is a copper layer.

Referring to FIG. 1-2, remove the metal layer 107 formed on the non-recessed areas and the metal in the recessed area 108, and remain a certain amount of metal in the recessed area 108. In the embodiment, the metal surface in the recessed area 108 is flush with the top surface of the second dielectric layer 104. The metal layer 107 formed on the non-recessed areas and the metal in the recessed area 108 can be removed by CMP or electropolishing, or the combination of CMP and electropolishing. Preferably, most of the metal layer 107 is removed by CMP and remain about 500 to 1000 angstrom of a continual metal layer 107 over the semiconductor structure, and then utilize electropolishing to remove the rest of the metal layer 107 on the non-recessed areas and the metal in the recessed area 108. The within die step height difference will be minimized during the CMP process. A method and apparatus for electropolishing is disclosed in patent application No. PCT/CN2012/075990 which can be cooperated herein by reference.

Referring to FIG. 1-3, remove the barrier layer 106 formed on the non-recessed areas and the hard mask layer 105 by thermal flow etching. A chemical gas for thermal flow etching can be selected from one or a mixed gas including one of the following: XeF$_2$, XeF$_4$, XeF$_6$. Taking XeF$_2$ for example, the chemical equation of XeF$_2$ and ruthenium (Ru) or cobalt (Co) is:

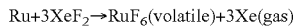

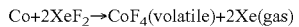

The temperature of thermal flow etching the barrier layer 106 including Ru is 0 to 400° C., and 100 to 350° C. is better. The pressure of thermal flow etching the barrier layer 106 including Ru is 10 m Torr to 20 Torr. The flow rate of XeF$_2$ is 0 to 50 sccm and the flow rate can be controlled by a mass flow controller. Under these conditions, the etch rate of Ru is almost the same with the etch rate of Ta, TaN, Ti or TiN. At 110° C., the etch rate of Ru is about 250 Å/min while the flow rate is 9 sccm. For the condition of thermal flow etching the barrier layer 106 including Co, the temperature is 120 to 600° C., and 200 to 400° C. is preferred. After the barrier layer 106 and the hard mask layer 105 are removed, the metal lines are separated, as shown in FIG. 1-3.

Before the barrier layer 106 is removed by the thermal flow etching, the surface of the substrate 101 may need to treat by solution which contains HF or by gas phase treatment which contains HF vapor. Because during the metal removal process by electropolishing, a layer of oxide film may be formed on the top surface of the barrier layer 106, and the oxide film may lower the etching efficiency of the barrier layer underneath. Therefore, before the barrier layer 106 is removed by the thermal flow etching, preferably, the surface of the substrate 101 is treated to remove the oxide film.

Accordingly, referring to FIG. 2, a semiconductor structure forming method according to an exemplary embodiment of the present invention can be summarized as follow:

Step 201: providing a semiconductor structure which includes a dielectric layer, a hard mask layer formed on the dielectric layer, recessed areas formed on the hard mask layer and the dielectric layer, a barrier layer including at least one layer of ruthenium or cobalt formed on the hard mask layer, sidewalls of the recessed areas and bottoms of the recessed areas, a metal layer formed on the barrier layer and filling the recessed areas;

Step 203: removing the metal layer formed on the non-recessed areas and the metal in the recessed areas, and remaining a certain amount of metal in the recessed areas;

Step 205: removing the barrier layer including ruthenium or cobalt formed on the non-recessed areas, and the hard mask layer by thermal flow etching.

In the embodiment, the metal surface in the recessed area is flush with the top surface of the dielectric layer.

Figures 1, 3:
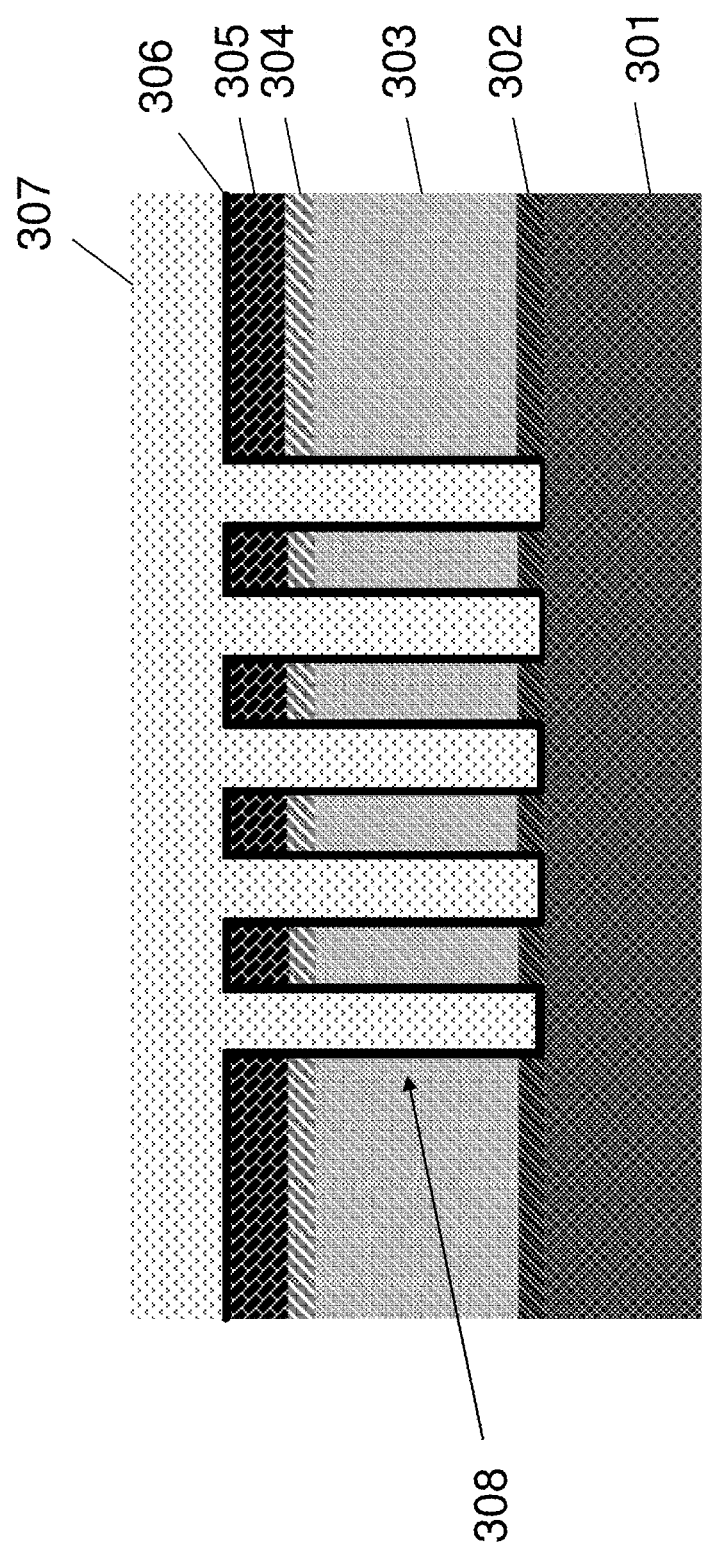
Figures 2, 3:
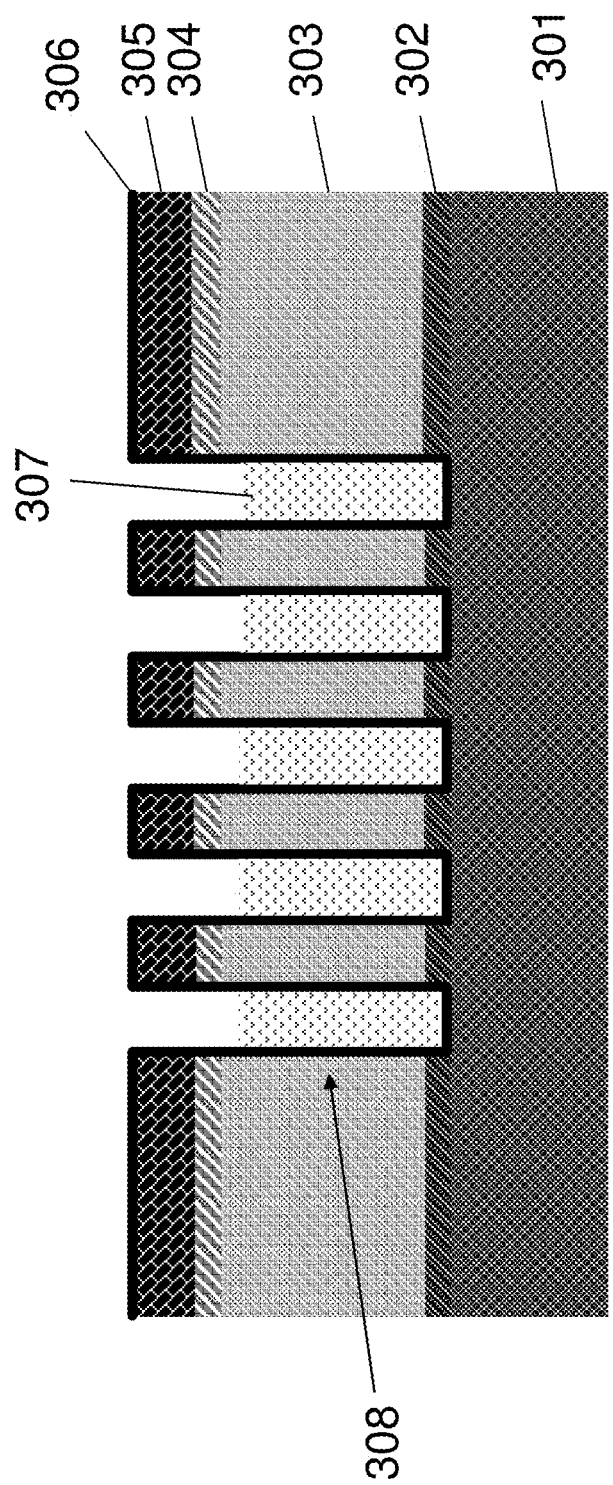
Figure 3:
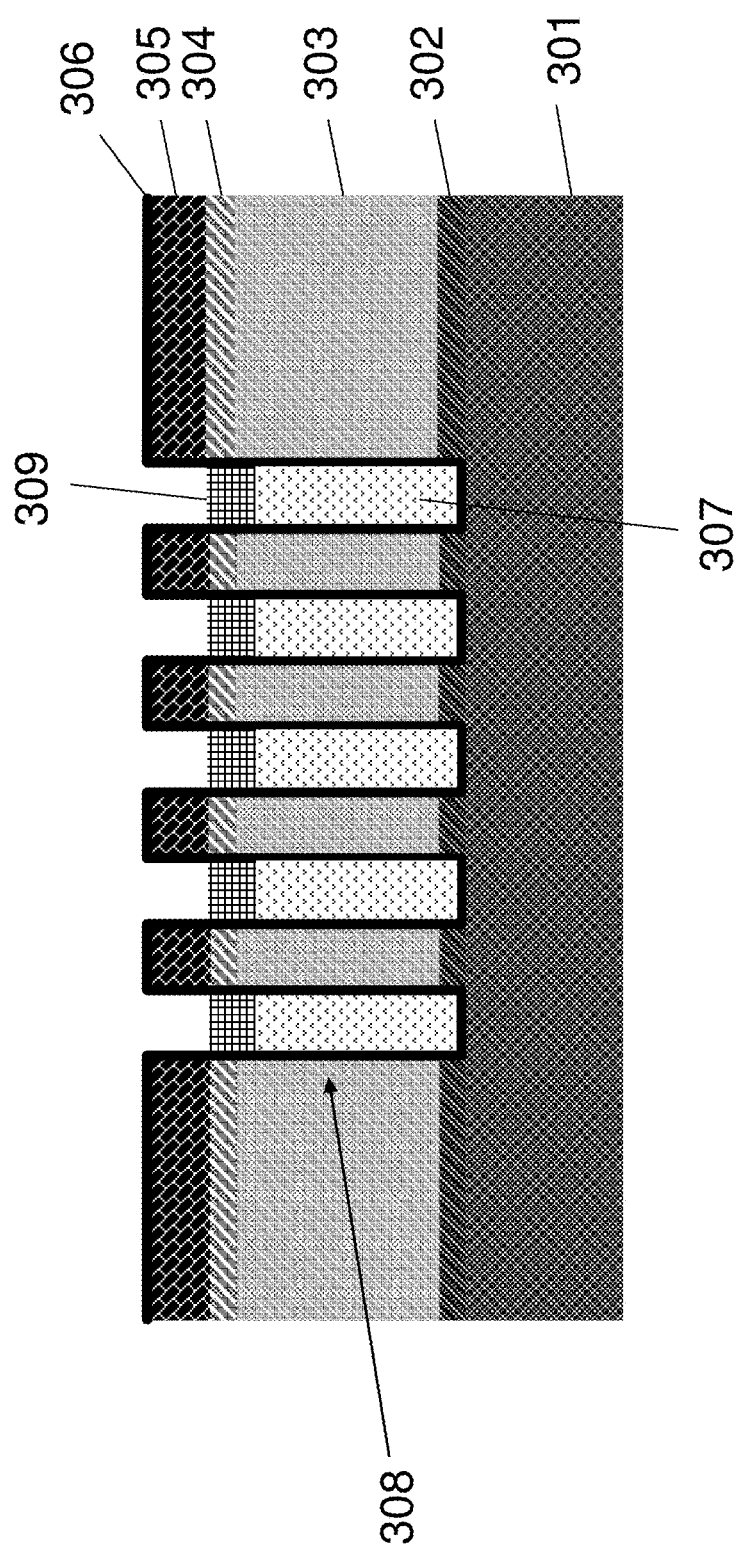
Figures 3, 4:
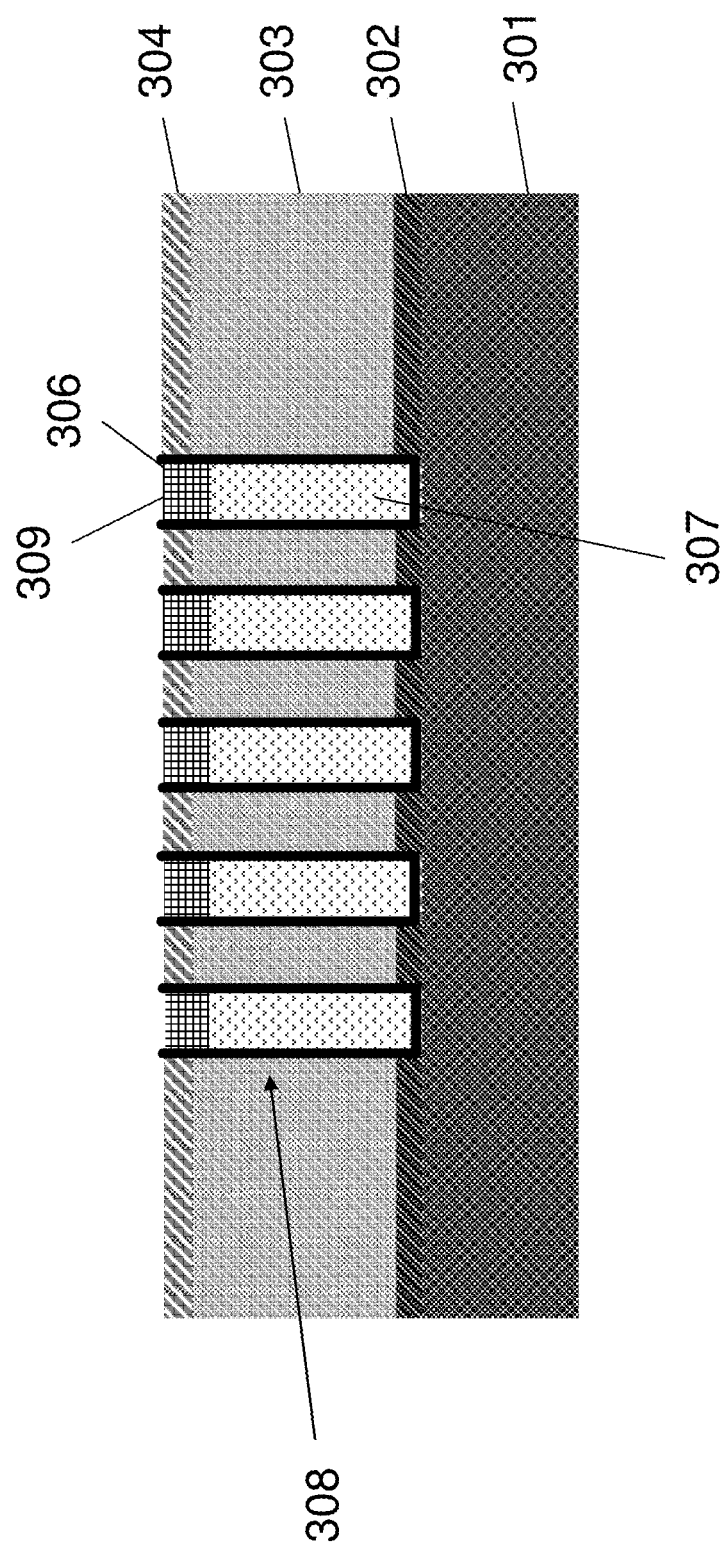
Figure 4:
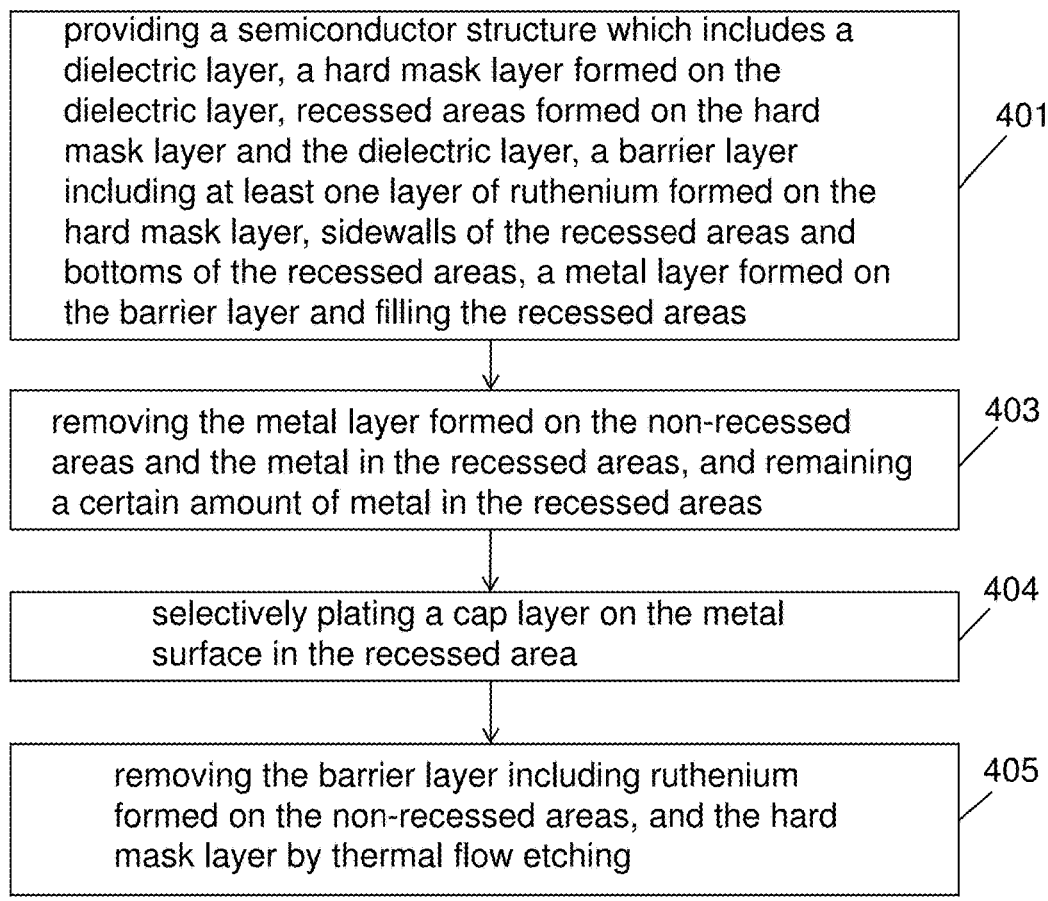

Please refer to FIG. 3-1 to FIG. 3-4, showing a process of forming a semiconductor structure according to another exemplary embodiment of the present invention. The semiconductor structure includes a substrate 301, such as a wafer. The substrate 301 may already contain IC devices and necessary contacting structures in it which are not shown in the figures. In some applications, an isolation layer 302 is formed on the substrate 301. The isolation layer 302 can be SiCN. A dielectric layer is formed on the isolation layer 302. If there is no isolation layer formed on the substrate, the dielectric layer can be formed on the substrate directly. The dielectric layer may include materials such as SiO$_2$, SiOC, SiOF, SiLK, BD, BDII, BDIII, etc. Preferably, the dielectric layer selects low-k dielectric material for reducing capacitance between the semiconductor structures in a semiconductor device. According to different structure requirement, the dielectric layer can be composed of two layers or more than two layers. In the embodiment shown in the figures, the dielectric layer includes two layers, a first dielectric layer 303 formed on the isolation layer 302 and a second dielectric layer 304 formed on the first dielectric layer 303. The first dielectric layer 303 can be a low-k dielectric layer. The second dielectric layer 304 can be TEOS. A hard mask layer 305 is deposited on the second dielectric layer 304. The material of the hard mask layer 305 may include titanium nitride, tantalum nitride, tungsten or tungsten nitride. Recessed areas, for example, trenches, vias, etc., are formed on the hard mask layer 305, the second dielectric layer 304, the first dielectric layer 303 and the isolation layer 302 by using existing methods in prior art. A recessed area 308 is shown in the figures as an example.

Then a barrier layer 306 is deposited on the hard mask layer 305, sidewall of the recessed area 308 and bottom of the recessed area 308. The material of the barrier layer 306 at least includes ruthenium for satisfying the requirement of 20 nm or below 20 nm node process. In order to improve the adhesivity between the barrier layer 306 and the hard mask layer 305, the second dielectric layer 304, the first dielectric layer 303, and the isolation layer 302, preferably, the barrier layer 306 includes two layers, a first barrier layer and a second barrier layer. The first barrier layer is formed on the hard mask layer 305, sidewall of the recessed area 308 and bottom of the recessed area 308. The material of the first barrier layer can choose titanium, titanium nitride, tantalum or tantalum nitride. The second barrier layer is formed on the first barrier layer, and the material of the second barrier layer is ruthenium. Typically, if the second barrier layer is ruthenium, the first barrier layer preferably chooses tantalum nitride.

A metal layer 307 is formed on the barrier layer 306 and fills the recessed area 308. In some applications, a metal seed layer can be deposited on the barrier layer 306 before depositing the metal layer 307. The metal seed layer may include the same material as the metal layer 307 in order to facilitate the deposition and bonding of the metal layer 307 onto the barrier layer 306. The metal layer 307 fills the recessed area 308 and covers non-recessed areas, as shown in FIG. 3-1. Preferably, the metal layer 307 is a copper layer.

Referring to FIG. 3-2, remove the metal layer 307 formed on the non-recessed areas and the metal in the recessed area 308, and remain a certain amount of metal in the recessed area 308. In the embodiment, the metal surface in the recessed area 308 is below the top surface of the second dielectric layer 304. The metal layer 307 formed on the non-recessed areas and the metal in the recessed area 308 can be removed by CMP or electropolishing, or the combination of CMP and electropolishing. Preferably, most of the metal layer 307 is removed by CMP and remain about 500 to 1000 angstrom of a continual metal layer 307 over the semiconductor structure, and then utilize electropolishing to remove the rest of the metal layer 307 on the non-recessed areas and the metal in the recessed area 308. The within die step height difference will be minimized during the CMP process. A method and apparatus for electropolishing is disclosed in patent application No. PCT/CN2012/075990 which can be cooperated herein by reference.

Referring to FIG. 3-3, selectively plate a cap layer 309 on the metal surface in the recessed area 308. Here "selectively plate" means that the cap layer 309 is only plated onto the metal surface in the recessed area 308, but there is no cap layer 309 plated on the surface of the barrier layer 306 formed on the non-recessed area. The top surface of the cap layer 309 in the recessed area 308 is flush with the top surface of the second dielectric layer 304. The cap layer 309 normally chooses the material of cobalt, but other materials can also be used.

Referring to FIG. 3-4, remove the barrier layer 306 formed on the non-recessed areas and the hard mask layer 305 by thermal flow etching. A chemical gas for thermal flow etching can be selected from one or a mixed gas including one of the following: XeF$_2$, XeF$_4$, XeF$_6$. Taking XeF$_2$ for example, the temperature of thermal flow etching the barrier layer 306 including Ru is 0 to 400° C., and 50 to 120° C. is better. The pressure of thermal flow etching the barrier layer 306 including Ru is 10 m Torr to 20 Torr. The flow rate of XeF$_2$ is 0 to 50 sccm and the flow rate can be controlled by a mass flow controller. Under these conditions, the etch rate of Ru is almost the same with the etch rate of Ta, TaN, Ti or TiN. At 110° C., the etch rate of Ru is about 250 Å/min. And when temperature is lower than 120° C., the action between XeF$_2$ and Co can be neglected.

Before the barrier layer 306 is removed by the thermal flow etching, the surface of the substrate 301 may need to treat by solution which contains HF or by gas phase treatment which contains HF vapor. Because during the metal removal process by electropolishing, a layer of oxide film may be formed on the top surface of the barrier layer 306, and the oxide film may lower the etching efficiency of the barrier layer underneath. Therefore, before the barrier layer 306 is removed by the thermal flow etching, preferably, the surface of the substrate 301 is treated to remove the oxide film.

Accordingly, referring to FIG. 4, a semiconductor structure forming method according to another exemplary embodiment of the present invention can be summarized as follow:

Step 401: providing a semiconductor structure which includes a dielectric layer, a hard mask layer formed on the dielectric layer, recessed areas formed on the hard mask layer and the dielectric layer, a barrier layer including at least one layer of ruthenium formed on the hard mask layer, sidewalls of the recessed areas and bottoms of the recessed areas, a metal layer formed on the barrier layer and filling the recessed areas;

Step 403: removing the metal layer formed on the non-recessed areas and the metal in the recessed areas, and remaining a certain amount of metal in the recessed areas, wherein the metal surface in the recessed area is below the top surface of the dielectric layer;

Step 404: selectively plating a cap layer on the metal surface in the recessed area, wherein the top surface of the cap layer in the recessed area is flush with the top surface of the dielectric layer;

Step 405: removing the barrier layer including ruthenium formed on the non-recessed areas, and the hard mask layer by thermal flow etching.

Figures 1, 5:
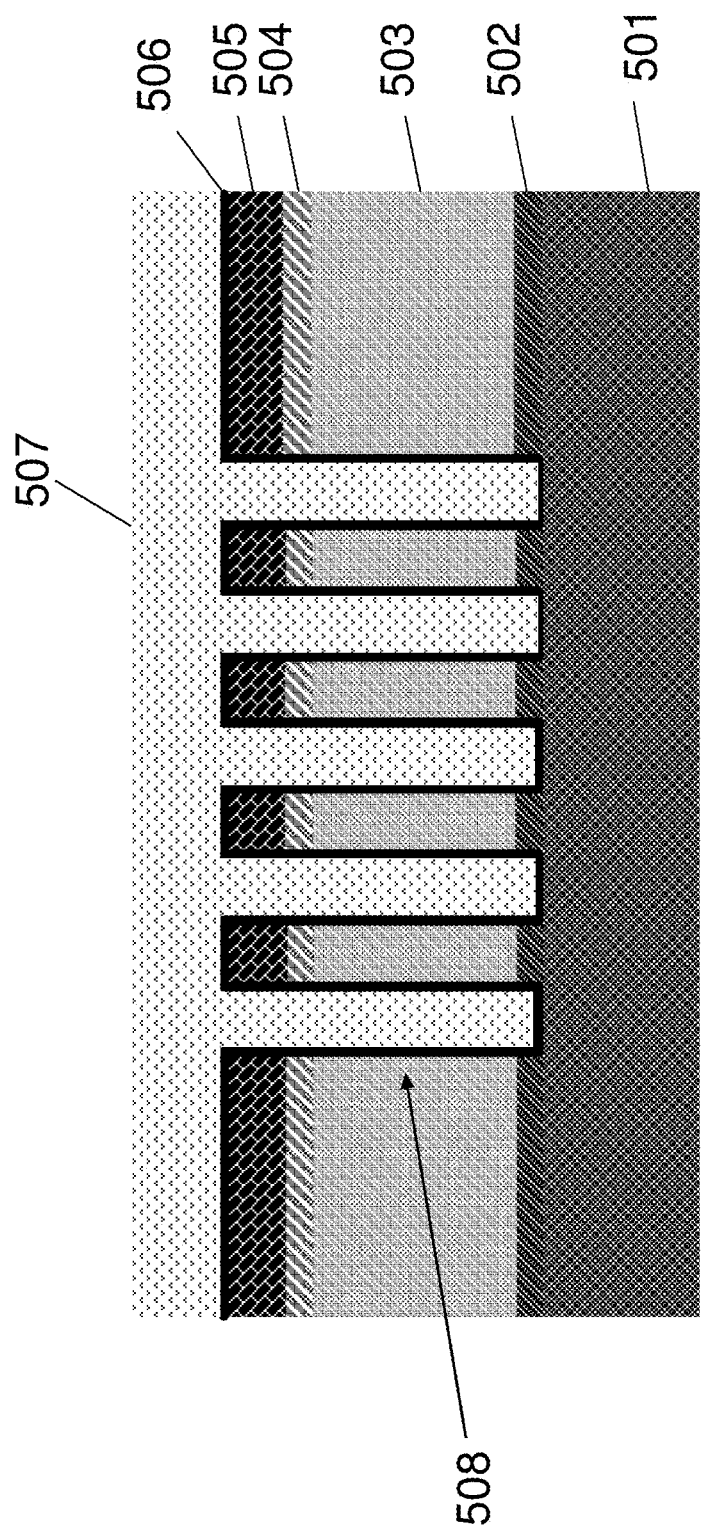
Figures 2, 5:
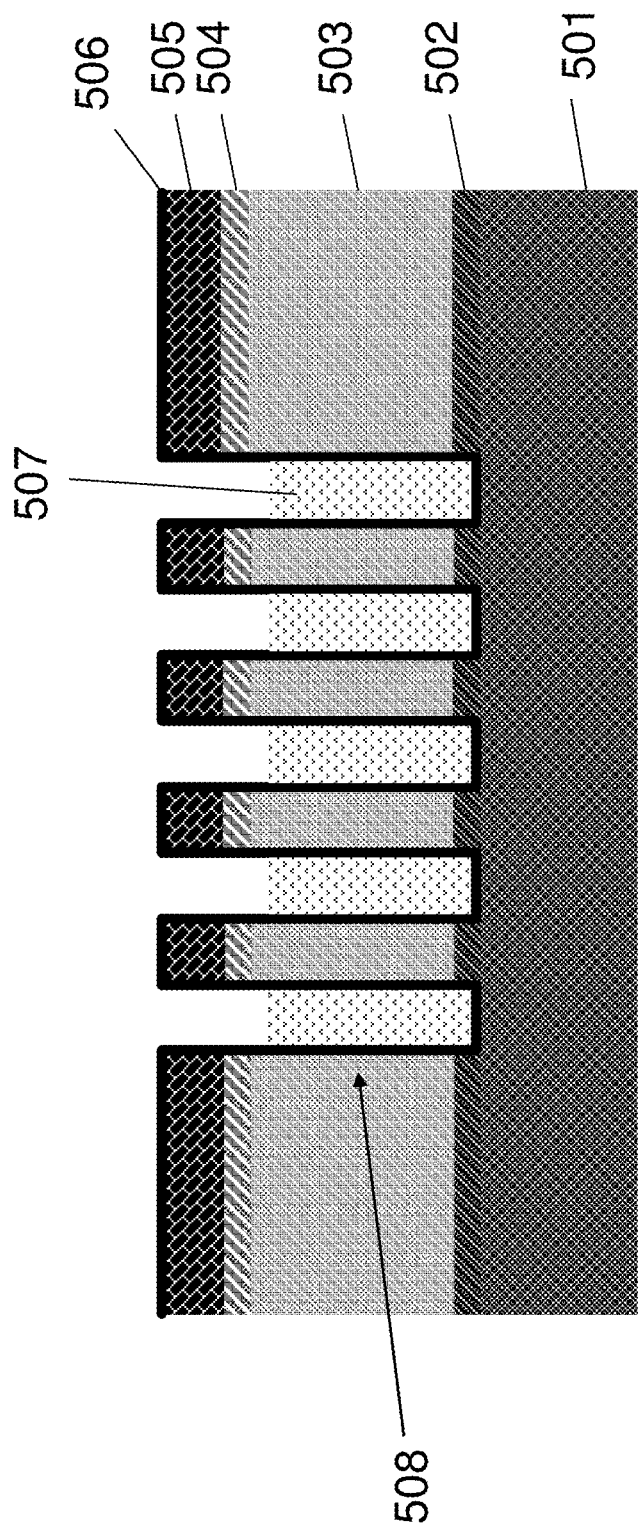

Please refer to FIG. 5-1 to FIG. 5-4, showing a process of forming a semiconductor structure according to another exemplary embodiment of the present invention. The semiconductor structure includes a substrate 501, such as a wafer. In some applications, an isolation layer 502 is formed on the substrate 501. The isolation layer 502 can be SiCN. A dielectric layer is formed on the isolation layer 502. If there is no isolation layer formed on the substrate, the dielectric layer can be formed on the substrate directly. The dielectric layer may include materials such as SiO$_2$, SiOC, SiOF, SiLK, BD, BDII, BDIII, etc. Preferably, the dielectric layer selects low-k dielectric material for reducing capacitance between the semiconductor structures in a semiconductor device. According to different structure requirement, the dielectric layer can be composed of two layers or more than two layers. In the embodiment shown in the figures, the dielectric layer includes two layers, a first dielectric layer 503 formed on the isolation layer 502 and a second dielectric layer 504 formed on the first dielectric layer 503. The first dielectric layer 503 can be a low-k dielectric layer. The second dielectric layer 504 can be TEOS. A hard mask layer 505 is deposited on the second dielectric layer 504. The material of the hard mask layer 505 may include titanium nitride, tantalum nitride, tungsten or tungsten nitride. Recessed areas, for example, trenches, vias, etc., are formed on the hard mask layer 505, the second dielectric layer 504, the first dielectric layer 503 and the isolation layer 502 by using existing methods in prior art. A recessed area 508 is shown in the figures as an example.

Then a barrier layer 506 is deposited on the hard mask layer 505, sidewall of the recessed area 508 and bottom of the recessed area 508. The material of the barrier layer 506 at least includes ruthenium or cobalt for satisfying the requirement of 20 nm or below 20 nm node process. In order to improve the adhesivity between the barrier layer 506 and the hard mask layer 505, the second dielectric layer 504, the first dielectric layer 503, and the isolation layer 502, preferably, the barrier layer 506 includes two layers, a first barrier layer and a second barrier layer. The first barrier layer is formed on the hard mask layer 505, sidewall of the recessed area 508 and bottom of the recessed area 508. The material of the first barrier layer can choose titanium, titanium nitride, tantalum or tantalum nitride. The second barrier layer is formed on the first barrier layer, and the material of the second barrier layer is ruthenium or cobalt. Typically, if the second barrier layer is cobalt, the first barrier layer preferably chooses titanium nitride, and if the second barrier layer is ruthenium, the first barrier layer preferably chooses tantalum nitride.

A metal layer 507 is formed on the barrier layer 506 and fills the recessed area 508. In some applications, a metal seed layer can be deposited on the barrier layer 506 before depositing the metal layer 507. The metal seed layer may include the same material as the metal layer 507 in order to facilitate the deposition and bonding of the metal layer 507 onto the barrier layer 506. The metal layer 507 fills the recessed area 508 and covers non-recessed areas, as shown in FIG. 5-1. Preferably, the metal layer 507 is a copper layer.

Referring to FIG. 5-2, remove the metal layer 507 formed on the non-recessed areas and the metal in the recessed area 508, and remain a certain amount of metal in the recessed area 508. In the embodiment, the metal surface in the recessed area 508 is below the top surface of the second dielectric layer 504. The metal layer 507 formed on the non-recessed areas and the metal in the recessed area 508 can be removed by CMP or electropolishing, or the combination of CMP and electropolishing. Preferably, most of the metal layer 507 is removed by CMP and remain about 500 to 1000 angstrom of a continual metal layer 507 over the semiconductor structure, and then utilize electropolishing to remove the rest of the metal layer 507 on the non-recessed areas and the metal in the recessed area 508. The within die step height difference will be minimized during the CMP process. A method and apparatus for electropolishing is disclosed in patent application No. PCT/CN2012/075990 which can be cooperated herein by reference.

Figures 3A, 5:
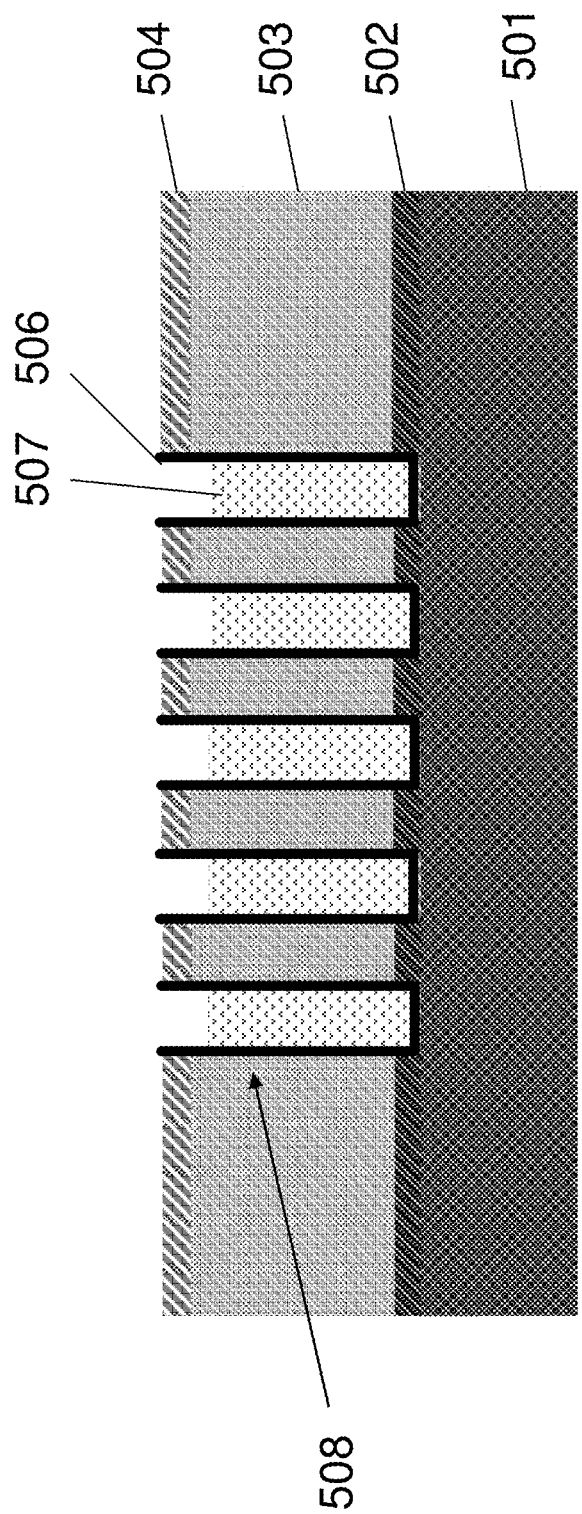
Figures 3B, 5:
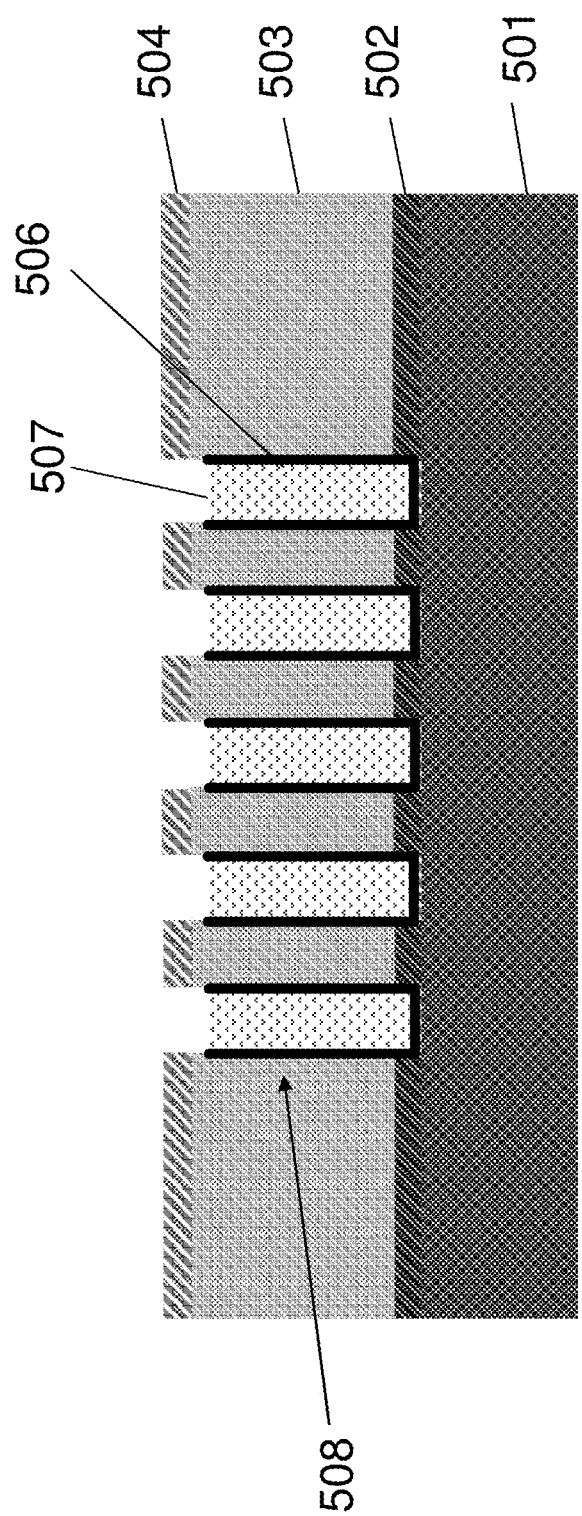
Figures 4, 5:
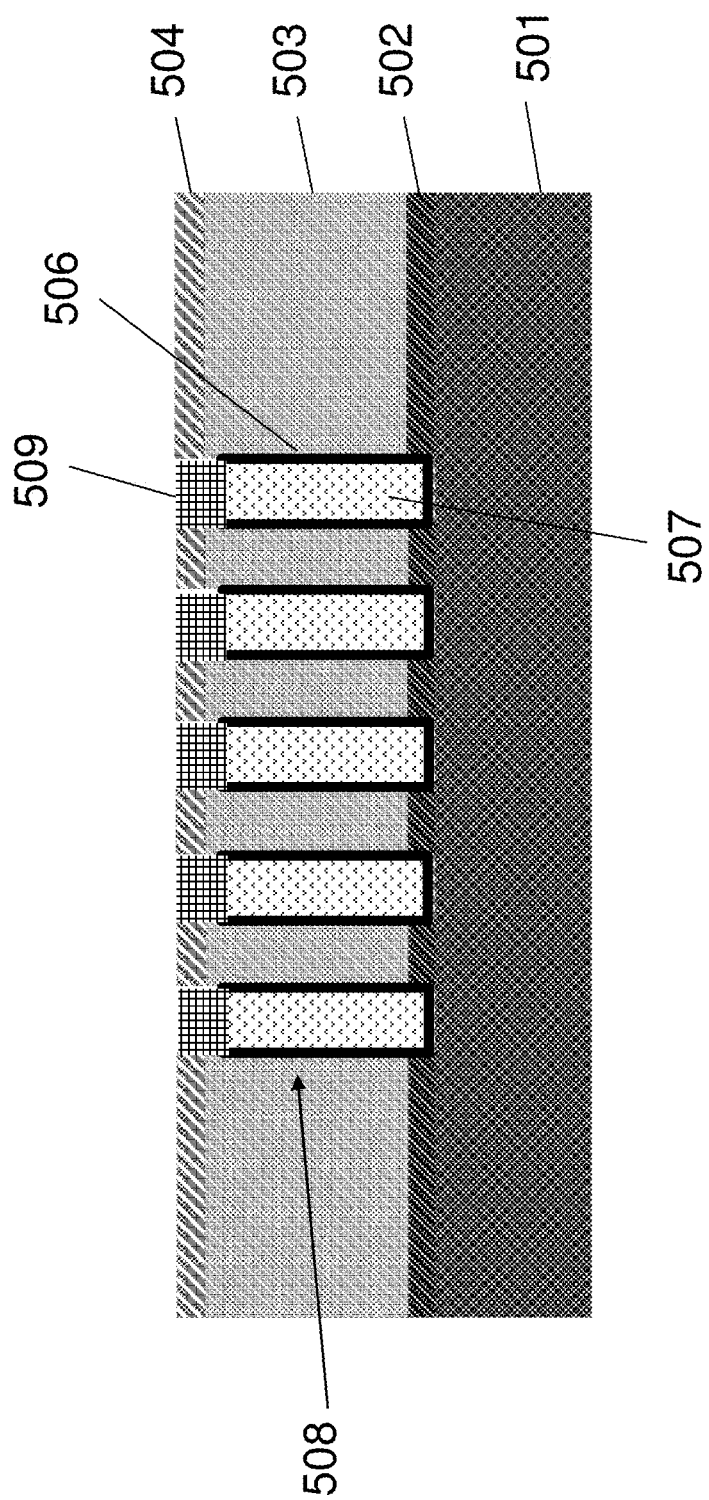

Remove the barrier layer 506 formed on the non-recessed areas and the hard mask layer 505 by thermal flow etching. During the process of removing the barrier layer 506 and the hard mask layer 505, the barrier layer 506 formed on the sidewall of the recessed area 508 may be etched partially. FIG. 5-3A and FIG. 5-3B show two extremes after the barrier layer 506 formed on the non-recessed areas and the hard mask layer 505 are removed by thermal flow etching. The actual process result is normally between the two extremes.

Before the barrier layer 506 is removed by the thermal flow etching, the surface of the substrate 501 may need to treat by solution which contains HF or by gas phase treatment which contains HF vapor. Because during the metal removal process by electropolishing, a layer of oxide film may be formed on the top surface of the barrier layer 506, and the oxide film may lower the etching efficiency of the barrier layer underneath. Therefore, before the barrier layer 506 is removed by the thermal flow etching, preferably, the surface of the substrate 501 is treated to remove the oxide film.

Referring to FIG. 5-4, selectively plate a cap layer 509 on the metal surface in the recessed area 508. The top surface of the cap layer 509 in the recessed area 508 is flush with the top surface of the second dielectric layer 504. The cap layer 509 normally chooses the material of cobalt, but other materials can also be used. Because there is the cap layer 509 plated on the metal surface in the recessed area 508, so the barrier layer 506 can be over etched for ensuring there is no residue of the barrier layer 506 on the non-recessed area.

Figure 6:
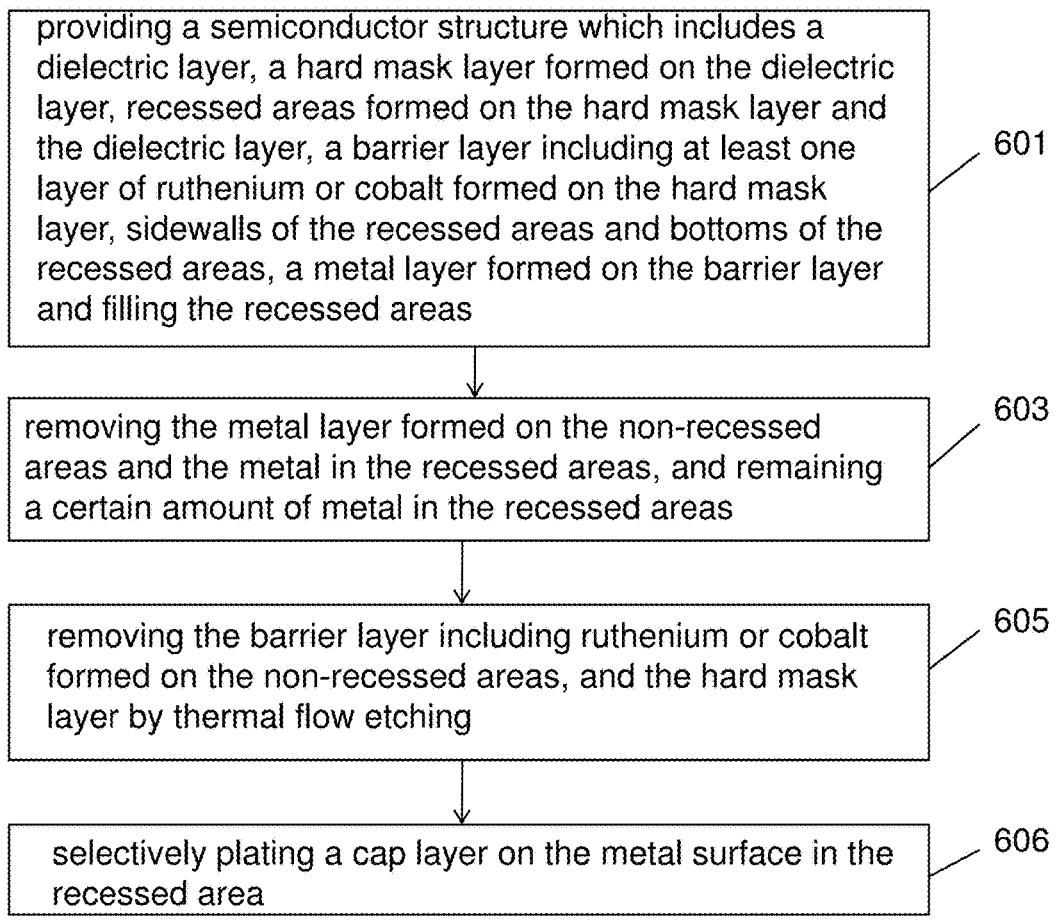
FIG. 6 is a flow chart illustrating a semiconductor structure forming method according to another exemplary embodiment of the present invention.

Accordingly, referring to FIG. 6, a semiconductor structure forming method according to another exemplary embodiment of the present invention can be summarized as follow:

Step 601: providing a semiconductor structure which includes a dielectric layer, a hard mask layer formed on the dielectric layer, recessed areas formed on the hard mask layer and the dielectric layer, a barrier layer including at least one layer of ruthenium or cobalt formed on the hard mask layer, sidewalls of the recessed areas and bottoms of the recessed areas, a metal layer formed on the barrier layer and filling the recessed areas;

Step 603: removing the metal layer formed on the non-recessed areas and the metal in the recessed areas, and remaining a certain amount of metal in the recessed areas, wherein the metal surface in the recessed area is below the top surface of the dielectric layer;

Step 605: removing the barrier layer including ruthenium or cobalt formed on the non-recessed areas, and the hard mask layer by thermal flow etching;

Step 606: selectively plating a cap layer on the metal surface in the recessed area, wherein the top surface of the cap layer in the recessed area is flush with the top surface of the dielectric layer.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

The invention claimed is:

1. A semiconductor structure forming method, comprising:
providing a semiconductor structure which includes a dielectric layer, a hard mask layer formed on the dielectric layer, recessed areas formed on the hard mask layer and the dielectric layer, a barrier layer including at least one layer of ruthenium or cobalt formed on the hard mask layer, sidewalls of the recessed areas and bottoms of the recessed areas, a metal layer formed on the barrier layer and filling the recessed areas;
removing the metal layer formed on the non-recessed areas and the metal in the recessed areas, and remaining a certain amount of metal in the recessed areas;
removing the barrier layer including ruthenium or cobalt formed on the non-recessed areas, and the hard mask layer by thermal gas phase etching, wherein a chemical gas for thermal gas phase etching is one or more selected from a group consisting of $XeF_2$, $XeF_4$, and $XeF_6$;
wherein the metal surface in the recessed area is below the top surface of the dielectric layer;
further comprising a step of selectively plating a cap layer on the metal surface in the recessed area;
wherein the step of selectively plating a cap layer on the metal surface in the recessed area is carried out before the step of removing the barrier layer including ruthenium or cobalt formed on the non-recessed areas, and the hard mask layer by thermal flow etching; and
further comprising treating the surface of the substrate by solution containing HF or gas phase treatment containing HF vapor before removing the barrier layer.

2. The method as claimed in claim 1, wherein the top surface of the cap layer in the recessed area is flush with the top surface of the dielectric layer.

3. The method as claimed in claim 1, wherein the cap layer chooses the material of cobalt.

4. The method as claimed in claim 1, wherein the barrier layer includes another layer of which material is titanium, titanium nitride, tantalum or tantalum nitride.

5. The method as claimed in claim 1, wherein the metal layer formed on the non- recessed areas and the metal in the recessed area is removed by CMP or electropolishing, or the combination of CMP and electropolishing.

6. The method as claimed in claim 1, wherein the metal layer is a copper layer.

* * * * *